United States Patent [19]

Momodomi

[11] Patent Number: 4,630,087
[45] Date of Patent: Dec. 16, 1986

[54] NONVOLATILE SEMICONDUCTOR MEMORY DEVICE

[75] Inventor: Masaki Momodomi, Yokohama, Japan

[73] Assignee: Kabushiki Kaisha Toshiba, Kawasaki, Japan

[21] Appl. No.: 613,059

[22] Filed: May 22, 1984

[30] Foreign Application Priority Data

Sep. 30, 1983 [JP] Japan .................. 58-180512

[51] Int. Cl.⁴ ............... H01L 29/78; H01L 27/10
[52] U.S. Cl. .................. 357/23.5; 357/23.1; 357/23.14; 365/185
[58] Field of Search ........... 365/185; 357/23.5, 23.14, 357/23.1

[56] References Cited

U.S. PATENT DOCUMENTS

| | | | |
|---|---|---|---|
| 3,728,695 | 4/1973 | Frohman-Bentchkowsky | 357/23.5 |
| 3,825,946 | 7/1974 | Frohman-Bentchkowsky | 357/23.5 |
| 4,477,883 | 10/1984 | Wada | 357/23.5 |
| 4,503,519 | 3/1985 | Arakawa | 357/23.5 |

FOREIGN PATENT DOCUMENTS 57141969 of 0000 Japan.
5634190 of 0000 Japan.

OTHER PUBLICATIONS

IEEE Trans. Elec. Dev., vol. ED-23, No. 4, Apr. 1976, "Electrically Alterable ... Structure", Iizuka et al., pp. 379-387.

Primary Examiner—Martin H. Edlow
Assistant Examiner—Jerome Jackson
Attorney, Agent, or Firm—Oblon, Fisher, Spivak, McClelland, & Maier

[57] ABSTRACT

In a nonvolatile semiconductor memory device having a matrix of electrically erasable and programmable memory cells each of which has a floating gate, an erase gate, and two control gates, a relationship among the potentials selectively applied to the floating gate, the erase gate, and the two control gates is preset to decrease changes in the threshold level of the half-selected memory cells, thereby achieving high reliability. In the writing mode, a voltage of +25 V is applied to the selected row and column control lines, a first low voltage of 0 V is applied to the remaining row and column control lines, and a second low voltage of +5 V is applied to a source control line. In the erasing mode, a low voltage of 0 V is applied to the selected row and column control lines, a first high voltage of +25 V is applied to the remaining row and column control lines, and a second high voltage of +20 V is applied to the source control line.

5 Claims, 19 Drawing Figures

F I G. 2
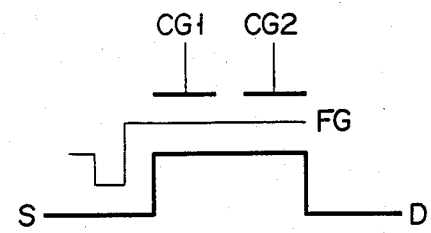
F I G. 3
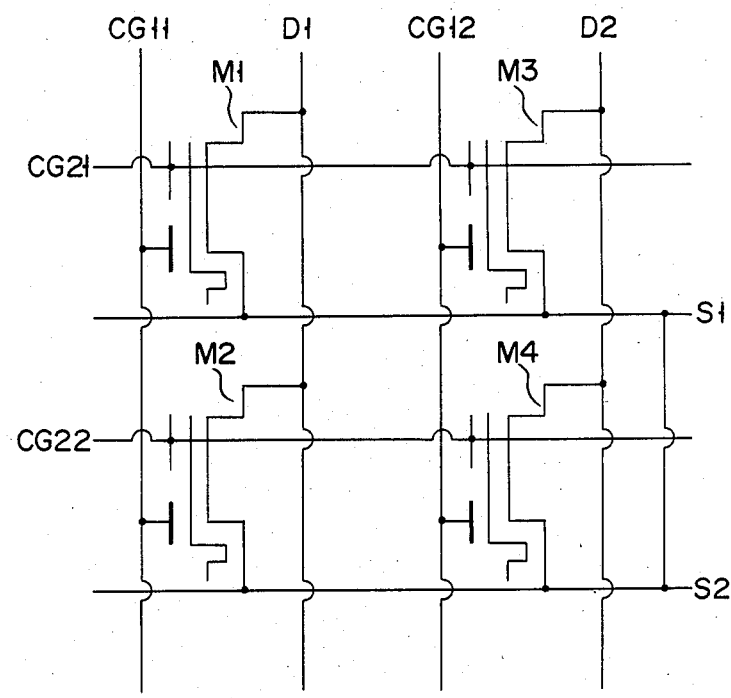

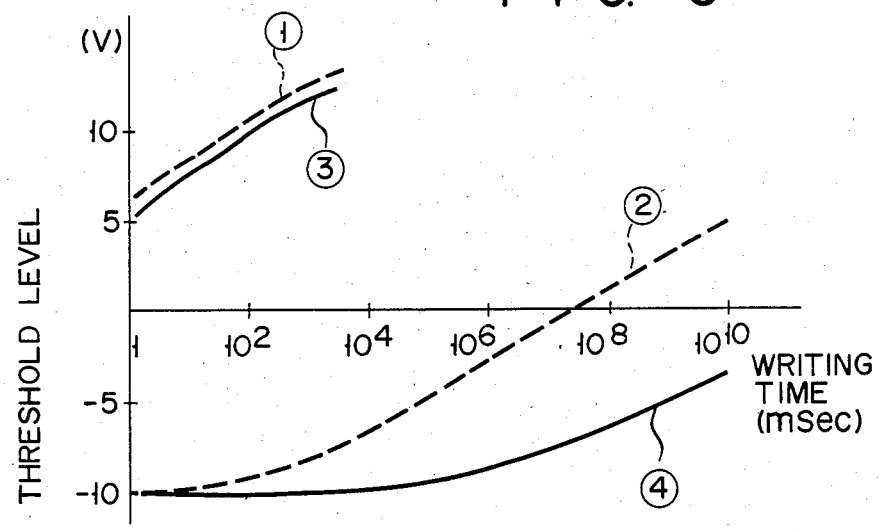

FIG. 6
| | SELECTED CELL | HALF-SELECTED CELL |
|---|---|---|
| CONVENTIONAL DEVICE | ⑤ 0V 0V / 20V | ⑥ 20V 0V / 20V |
| EMBODIMENT | ⑦ 0V 0V / 20V | ⑧ 25V 0V / 20V |
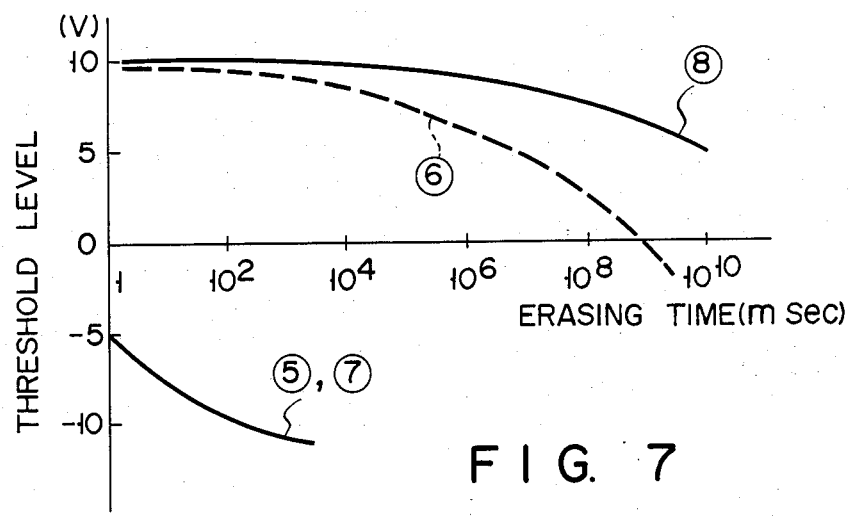
FIG. 7
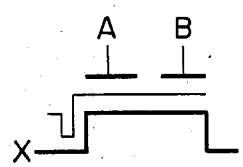
FIG. 8A
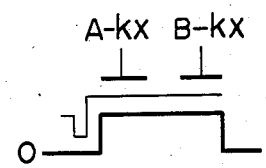
FIG. 8B
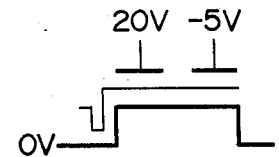
FIG. 8C

NONVOLATILE SEMICONDUCTOR MEMORY DEVICE

BACKGROUND OF THE INVENTION

The present invention relates to a nonvolatile semiconductor memory device used as an E$^2$PROM (Electrically Erasable and Programmable ROM).

A MOSFET structure having a floating gate is known as a conventional E$^2$PROM memory cell. In order to electrically perform selective writing or erasing in a one-cell/bit arrangement, each memory cell has first and second control gates which are capacitively coupled to a floating gate, and an erase gate which can exchange carriers with the floating gate by utilizing the tunnel effect. The erase gate comprises a doped layer which has the same conductivity type as that of a source region and which is formed adjacent to a channel region of the MOSFET.

The term "writing" means charge injection in the floating gate throughout the specification. The term "erasing" means discharge of the floating gate. When the memory cell described above comprise the n-channel type, writing and erasing are performed as follows. In the writing mode, a high positive voltage (e.g., +20 V) is applied to the first and second control gates, and a low voltage (e.g., 0 V) is applied to the erase gate. In this case, the floating gate is set at a high positive potential due to capacitive coupling with the first and second control gates. As a result, electrons are injected from the erase gate to the floating gate. This injection is performed by the so-called tunnel effect such that the electrons are injected from the erase gate to the floating gate through a thin insulating film therebetween. In the erasing mode, which is opposite the writing mode, a low voltage is applied to the first and second control gates, and a high positive voltage is applied to the erase gate. The electrons charged on the floating gate are emitted therefrom to the erase gate.

The threshold level of the memory cell increases in the writing mode. The threshold level of the memory cell decreases in the erasing mode. Therefore, a read operation is performed by applying a proper read voltage (e.g., +5 V) to one of the first and second control gates, and by sensing whether or not a drain-source path is rendered conductive.

A memory array having a plurality of memory cells is formed on a semiconductor substrate in a matrix form. The first and second control gates of the respective memory cells are commonly connected along the orthogonal directions. One of the first and second control gates serves as row control lines, and the other one thereof serves as column control lines. The row and column control lines are selectively driven by row and column decoders, respectively. The drain regions of the respective memory cells are commonly connected as drain control lines along one direction of the matrix and are selectively driven by the column or row decoder. The erase gates and source regions of all memory cells are commonly connected as a source control line. The source control line is driven by a source decoder.

In the memory array having the arrangement described above, selective writing is performed such that a high voltage is applied to selected row and column control lines, and a low voltage is applied to the remaining row and column control lines and the source control line. Selective erasing is performed such that the low voltage is applied to the selected row and column control lines, and the high voltage is applied to the remaining row and column control lines and the source control line.

In the selective writing mode, nonselected memory cells which are located along the selected row and column are set in the half-selected state since one of the control gates of each of these nonselected memory cells is set at the high voltage. In the half-selected memory cell, an electric field, which is smaller than that in the writing mode, is applied to the thin insulating film on the erase gate. As a result, electrons are gradually injected in the floating gates of these half-selected memory cells, and the threshold level thereof gradually increases. When selective writing is repeated a plurality of times, the data of these half-selected memory cells are inverted.

The same problem occurs in the selective erasing mode. In this case, the threshold level of the half-selected memory cells gradually decreases.

SUMMARY OF THE INVENTION

It is an object of the present invention to decrease a change in the threshold level of the half-selected memory cells, thereby improving reliability of an E$^2$PROM.

In order to achieve the above object of the present invention, there is provided a memory device which has at least one of the new writing and erasing modes. The basic configurations of the memory cells and the memory array are the same as those of the conventional ones. According to the present invention, in the writing mode, wherein a high voltage is applied to the selected row and column control lines and low voltages are applied to the remaining row and column control lines and a source control line, the low voltage applied to the source control line is higher than that applied to the nonselected row and column control lines. Similarly, in the erasing mode, wherein the low voltage is applied to the selected row and column control lines and the source control line, and high voltages are applied to the nonselected row and column control lines and the source control line, the high voltage applied to the nonselected row and column control lines is higher than that applied to the source control line.

Several methods are proposed to update the storage contents of the E$^2$PROM. According to one of these methods, all memory cells within a memory region which is subjected to updating are set in the writing mode. Thereafter, the selected memory cells are subsequently subjected to erasing, thereby programming a predetermined data pattern. When this method is adopted, a change in the threshold level of the half-selected memory cells presents the problem. Only the erasing mode must be improved in this method. According to another method, all memory cells within the memory region subjected to updating are set in the erasing mode. The selected memory cells are sequentially set in the writing mode, thereby obtaining the desired data pattern. According to this method, a change in threshold level of the half-selected memory cells in the writing mode becomes the problem. Therefore, only the writing mode must be improved in this method.

According to still another method, data updating is performed by bit selection without performing writing or erasing in the entire memory region. According to this method, both the writing and erasing modes must be improved.

BRIEF DESCRIPTION OF THE DRAWINGS

FIGS. 1A to 1C show a structure of a memory cell according to an embodiment of the present invention, in which FIG. 1A is a plan view thereof, and FIGS. 1B and 1C are sectional views thereof along line A–A' and B–B', respectively;

FIG. 2 shows a representation of an electric circuit of the memory cell shown in FIGS. 1A to 1C;

FIG. 3 shows an equivalent circuit of a memory array according to the embodiment shown in FIGS. 1A to 1C;

FIG. 4 is a table showing the relationship between voltages applied to the selected and half-selected cells of the present invention and those applied to conventional ones when the memory array is set in the writing mode;

FIG. 5 is a graph showing changes in the threshold level of each memory cell (FIG. 4) as a function of write time;

FIG. 6 is a table showing the relationship between voltages applied to the selected and half-selected cells of the present invention and those applied to conventional ones when the memory array shown in FIG. 3 is set in the erasing mode;

FIG. 7 is a graph showing changes in the threshold level of each memory cell (FIG. 6) as a function of erase time;

FIGS. 8A to 8C respectively show representations of electric circuits for explaining the reasons why the change in the threshold level of the half-selected cell is small;

DETAILED DESCRIPTION OF THE PREFERRED EMBODIMENTS

Figure 1A:
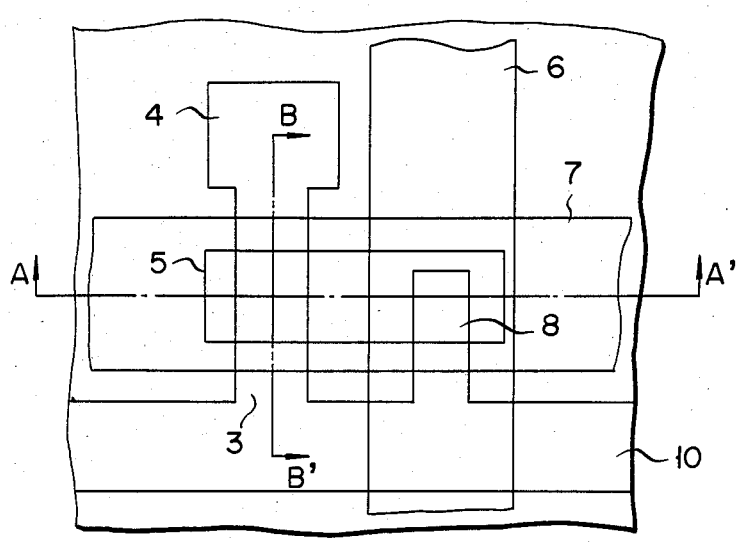
Figure 1B:
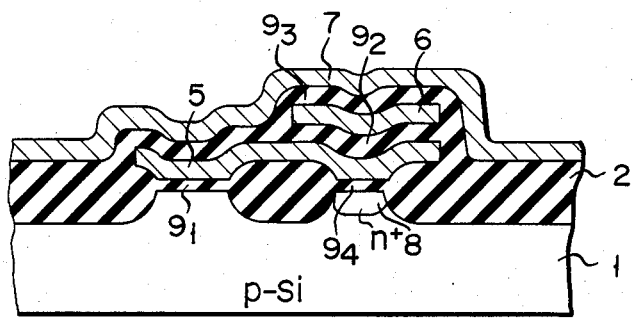
Figure 1C:
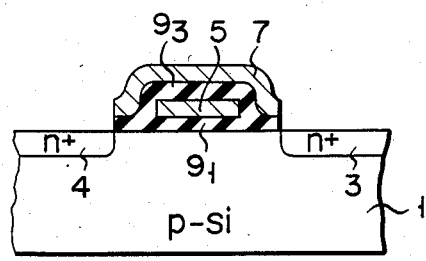

FIGS. 1A to 1C respectively show a memory cell according to an embodiment of the present invention. An n+-source region 3 and an n+-drain region 4 are formed in a p-Si substrate 1. A floating gate 5 of a doped poly-Si layer is formed on the channel region between the source and drain regions 3 and 4 through a gate insulating film (SiO$_2$) 9$_1$. A thick SiO$_2$ layer 2 having a thickness of about 1 $\mu$m is formed on the field region. First and second control gates 6 and 7 which are electrically insulated from each other through gate insulating films (SiO$_2$) 9$_2$ and 9$_3$ are sequentially formed on the floating gate 5. The floating gate 5 is formed of a first doped poly-Si layer, the first control gate 6 is formed of a second doped poly-Si layer, and the second control gate 7 is made of a third doped poly-Si layer. As shown in FIG. 1C, the floating gate 5 has an offset structure wherein it covers the central portion of the channel region. The second control gate 7 covers the remaining portion of the channel region. An erase gate 8 of an n+-layer is formed in the vicinity of the channel region. The floating gate 5 extends to a position above the erase gate 8, so that the floating gate 5 overlaps the erase gate 8 through a thin gate insulating film (SiO$_2$) 9$_4$ which allows the tunnel effect therethrough. The source region 3 is integrally formed with the erase gate 8 through an n+-layer 10 of the same material as the source region 3 and the erase gate 8.

In a preferred embodiment, the gate insulating films 9$_1$, 9$_2$, and 9$_3$ have thicknesses 500 Å, 800 Å, and 800 Å, respectively. The first and second control gates 6 and 7 are capacitively coupled to the floating gate 5. In this case, the capacitances between the first control gate 6 and the floating gate 5 and between the second control gate 7 and the floating gate 5 are both set to be 0.3 pF. The gate insulating film 9$_4$ on the erase gate 8 has a thickness of about 100 Å.

FIG. 2 shows a representation of an electric circuit of the memory cell. Reference symbol S denotes a source region commonly connected to the erase gate; D, a drain region; FG, a floating gate; CG1, a first control gate; and CG2, a second control gate.

The memory array, having a plurality of memory cells as described above, is formed on the p-Si substrate in a matrix form. In this case, the n+-layer 10 for connecting the source region 3 and the erase gate 8 are continuously formed along a plurality of memory cells on each row and serve as the source control line. Similarly, the first control gate 6 is continuously formed along a plurality of memory cells on each column and serves as the column control line. The second control gate 7 is also continuously formed along the plurality of memory cells on each row and serves as the row control line. The drain region 4 is commonly connected to the plurality of memory cells on each column through a metal wiring layer (not shown), which serves as the drain control line.

FIG. 3 shows an equivalent circuit of the 4-bit memory array. Reference symbols M1 to M4 denote memory cells, D1 and D2, drain control lines, S1 and S2, source control lines, CG21 and CG22, row control lines, and CG11 and CG12, column control lines. The source control lines S1 and S2 are commonly connected to a source driver (not shown).

For the memory array matrix arranged as described above, the writing operation of the memory cell M1 is described with reference to the conventional method. In the conventional writing mode, a high voltage (+20 V) is applied to the row control line CG21 and the column control line CG11, and a low voltage (0 V) is applied to the row control line CG22, the column control line CG12, the drain control lines D1, and D2 and the source control lines S1 and S2. In this case, in the memory cells M2 and M3 of the nonselected cells M2, M3, and M4, the high voltage is applied to one of the two control gates of each of the cells and the cells are set in the half-selected mode.

On the other hand, according to the present invention, a low voltage of 0 V is applied to the nonselected row control line CG22 and the nonselected column control line CG12, a low voltage of +5 V is applied to the source control lines S1 and S2, and a high voltage of +25 V is applied to the selected row and column control lines CG21 and CG11. In this case, the p-Si substrate potential is set at 0 V. FIG. 4 shows the relationships between the selected and half-selected cells of the matrix of this embodiment and between those of the convention method. The writing conditions (potentials) of a selected cell ① in the conventional case and the selected cell ③ of this embodiment are substantially the same. However, the write conditions (potentials) of a half-selected cell ② in the conventional case and the half-selected cell ④ of this embodiment differ from each other. In particular, an electric field applied to the SiO₂ layer on the erase gate in the half-selected cell ④ is smaller than that in the half-selected cell ② in the conventional case. As a result, changes in threshold level of the half-selected cell ④ are smaller than those of the half-selected cell ② in the conventional case.

FIG. 5 shows the measured results of changes in the threshold level as a function of time in the memory cells ① to ④. The writing is performed after all the memory cells are initialized and erased (threshold level Vt=−10 V). As apparent from FIG. 5, the writing characteristics of the memory cells ① and ③ are substantially the same. However, changes in the threshold level of the half-selected cell ④ are smaller than those of the half-selected cell ②.

In the memory array matrix in FIG. 3, the memory cell M1 is erased in a different manner compared to the conventional case wherein the corresponding cell is erased. In the conventional erasing mode, a low voltage (0 V) is applied to the row and column control lines CG21 and CG11, and a high voltage (+20 V) is applied to the row and column control lines CG22 and CG12 and the source control lines S1 and S2. In this case, in the memory cells M2 and M3 of the nonselected cells M2, M3, and M4, the high voltage is applied to one of the two control gates of each of the corresponding cells, and the cells are set in the half-selected state.

However, according to this embodiment, a low voltage of 0 V is applied to the selected row and column control lines CG21 and CG11, a high voltage of +20 V is applied to the source control lines S1 and S2, and a high voltage of +25 V is applied to the remaining row column control lines CG22 and CG12. The p-Si substrate potential is set to be 0 V. FIG. 6 shows the relationships between the potentials at the selected and half-selected cells of this embodiment and between those in the conventional case. In the erasing mode, the potential at a selected cell ⑤ in the conventional case is substantially the same as that at a selected cell ⑦ in this embodiment. However, the potential at a half-selected cell ⑧ of this embodiment differs from that at a half-selected cell ⑥ in the conventional case. As a result, changes in the threshold level of the half-selected cell ⑧ are smaller than those of the half-selected cell ⑥ in the conventional case.

FIG. 7 shows the measured results of changes in the threshold level of the memory cells ⑤ to ⑧ shown in FIG. 6 as a function of erase time. Erasing is performed after all the memory cells are initialized (threshold level Vt=+10 V) in the writing mode. As apparent from FIG. 7, the erasing characteristics of the selected cells ⑤ and ⑦ are the same. However, changes in threshold level of the half-selected cell ⑧ are greatly smaller than those of the half-selected cell ⑥.

The explanation of why the changes in threshold level of the half-selected cell ④ of the present invention are smaller than those of the conventional half-selected cell ② will now be described in detail. As shown in FIG. 8A, assume that potentials A and B are applied to the two control gates and that potential x is applied to the erase gate.

When potential X is shifted to 0 V with the substrate potential Vs kept at 0 V, and with the electrical field of the insulating film on the erase gate kept the same as that in FIG. 8A, the individual potential relationships are as shown in FIG. 8B. Symbol K in FIG. 8B is a constant introduced because the potentials of each gate were shifted while the Vs=0 V relationship was maintained. The value of K is determined by the relationship between the value of the capacitance between the first and second control gate and the floating gate and the value of the capacitance between the floating gate and the substrate and erase gate. In general, in order to obtain good write/erase characteristics, the conditions are preset so that the constant k is set to be 1. The reason for this will be described later on. When the constant k is set to be substantially 1, the potentials at the half-selected cell ④ in FIG. ④ become equivalent, as shown in FIG. 8C. As apparent from a comparison of the relationship between potentials in FIG. 8C and that in the half-selected cell ②, the electric field between the floating gate and the erase gate of the half-selected cell ④ is smaller than that of the cell ②. As a result, there is a difference between changes in threshold levels of the half-selected cells ② and ④.

Referring to FIG. 8B, the reason why the constant k is set to be substantially 1 is given as follows. Assume that the capacitances between the first control gate and the floating gate and between the second control gate and the floating gate are given to be CCF1 and CCF2, a capacitance between the floating gate and the erase gate is given to be CE, and a capacitance between floating gate and the substrate is given to be CFS. At the same time, assume that the potentials at the first and second control gates are given to be VCG1 and VCG2, a potential at the erase gate is given to be VE, and a substrate potential is given to be VS. In this case, a potential VFG at the floating gate is given as follows:

$$VFG = (CCF1 \cdot VCG1 + CCF2 \cdot VCG2 + CE \cdot VE + CFS \cdot VS)/(CCF1 + CCF2 + CE + CFS) \quad \ldots (1)$$

The write and erase characteristics depend on a potential difference (VFG−VE) between the floating gate and the erase gate. By way of simplicity, assume that the substrate potential VS=0. In FIG. 8A, we obtain the following equation for VCG1=A, VCG2=B and VE=x:

$$VFG - VE = \{(A \cdot CCF1 + B \cdot CCF2 + x \cdot CE)/(CCF1 + CCF2 + CE + CFS)\} - x \quad \ldots (2)$$

In FIG. 8B, we obtain the following equation for $VCG1=(A-kx)$, $VCG2=(b-kx)$ and $VE=0$:

$$VFG - VE = \{(A-kx)CCF1 + (B-kx)CCF2\}/(CCF1 + CCF2 + CE + CFS) \quad \ldots (3)$$

When the right-hand sides of equations (2) and (3) are equal, the constant k is given as follows:

$$K = 1 + CFS/(CCF1 + CCF2) \quad \ldots (4)$$

In order to obtain good write and erase characteristics, the capacitances between the first control gate and the floating gate and between the second control gate and the floating gate are set to be large. In other words, a sum (CCF1+CCF2) must be greater than the capacitance CFS. Therefore, k=1 is derived from equation (4).

The more detailed circuit arrangement of this embodiment will now be described.

Figure 9:
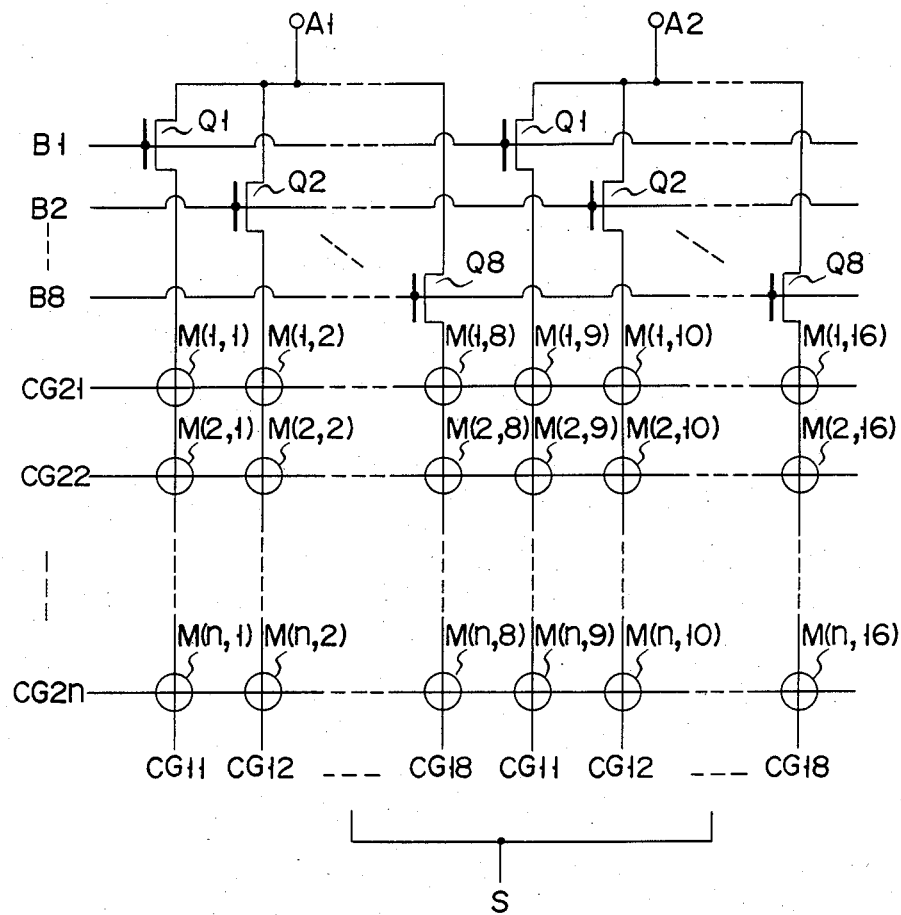
FIG. 9 shows a detailed arrangement of the memory array of the present invention.

FIG. 9 shows an 8-bit write type memory array matrix. Memory cells M(i,j) are grouped on rows in units of eight bits. Eight column control lines CG11, CG12, . . . , and CG18 of the memory cells of each block are commoly connected to terminals A1, A2, . . . in units of blocks through the transfer gate MOSFETs Q1, Q2, . . . and Q8, respectively. The gates of the MOSFETs Q1, Q2, . . . , and Q8 of the respective blocks are commonly connected to terminals B1, B2, . . . , and B8. Row control lines CG21, CG22, . . . , and CG2n are provided in units of rows independent of blocks. Reference symbol S denotes a common source control line of all bits. The drain control line is omitted in FIG. 9.

Data updating of the memory array matrix will be performed in the following manner. Assume that the memory cells M(1,1) and M(1,9) are to be updated. A low voltage is applied to the row control line CG21 and the column control lines CG11 of the respective blocks, and a high voltage is applied to the remaining row and column control lines and the source control line. Electrons are discharged from the floating gates of the memory cells M(1,1) and M(1,9) irrespective of the previous operating conditions, so that the cells M(1,1) and M(1,9) are set in the erased state ("0"). In order to write data "0" in the memory cell M(1,1) and data "1" in the memory cell M(1,9), the high voltage is applied to the terminal B1, and the low voltage is applied to the remaining terminals B2, . . . , and B8. At the same time, the low voltage is applied to the terminal A1, and the high voltage is applied to the terminal A2. Simultaneously, the high voltage is applied to the row control line CG21, and the low voltage is applied to the source control line S. As a result, the memory cell M(1,1) is set at logic "0". However, electrons are injected in the floating gate of the memory cell M(1,9), so that the memory cell M(1,9) is set at logic "1".

In the arrangement shown in FIG. 9, the source control line S is common to all bits. However, independent source control lines may be arranged for respective blocks. The memory array may be grouped into a plurality of blocks along the column direction. In this case, a decoder is required to select the source control line, but the number of half-selected memory cells can be decreased.

The decoders for setting the potentials at the row, column, and source control lines in the erasing and writing modes as described above are illustrated in FIGS. 10 and 12.

Figure 10:
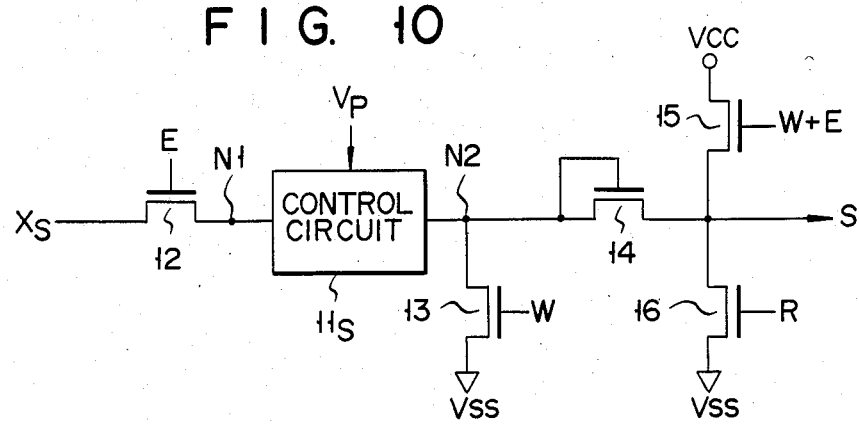
FIG. 10 is a circuit diagram of a source decoder.

FIG. 10 shows a source decoder. Reference symbol XS denotes an input signal, and 11 denotes a boosted potential (+25 V). Vcc is set at 5 V, and Vss is set at 0 V. Reference symbols E, W, and R denote control signals which are set at "H" level in the erasing, writing, and reading modes, respectively. A Vp control circuit 11S generates a voltage Vp=+25 V at a node N2 when a node N1 is set at "H" level, and 0 V at the node N2 when the node N1 is set at "L" level. Reference numerals 12 to 16 denote n-channel E-type MOSFETs.

The operation of the source decoder is performed in the following manner. In the erasing mode, E="H" and W=R="L" are established, so that the transfer gate MOSFETs 12 and 15 are turned on. In the selected circuit, XS="H" is established, so that the node N1 is set at "H" level. In this case, the Vp control circuit 11S generates Vp (=+25 V) which appears at the node N2. In this case, the voltage Vp drops through the MOSFETs 14 and becomes 20 V, so that a voltage of ±20 V is applied to the source control line S. In the nonselected circuit, XS="L" is given, and the Vp control circuit 11S generates a voltage of 0 V which appears at the node N2. In this case, the MOSFET 15 is held ON, so the voltage Vcc (=+5 V) is applied to the source control line S. In the writing mode, E=R="L" and W="H" are established, so that the node N1 is set at 0 V irrespective of the logic level ("H" or "L") of XS. Therefore, the MOSFET 14 is held OFF, and the voltage Vcc (=+5 V) is applied to the source control line S through the MOSFET 15. In the reading mode, R="H" is established, and the MOSFET 16 is turned on. As a result, the source control line S is set at 0 V.

Figure 11:
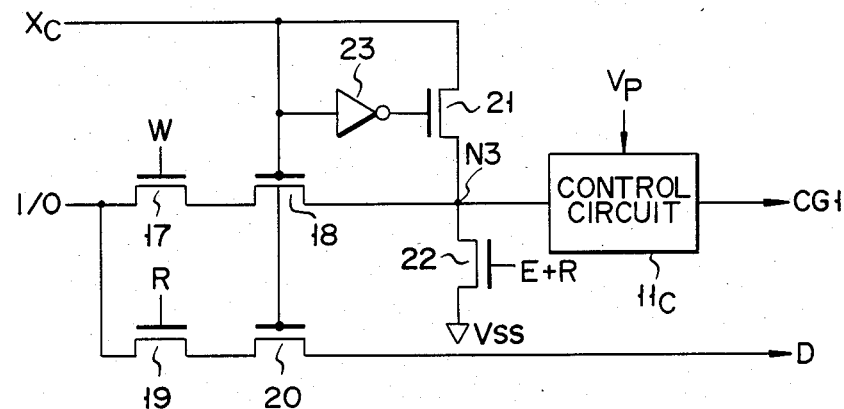
FIG. 11 is a circuit diagram of a column decoder for selecting a column control line and a drain control line.

FIG. 11 shows a column decoder for selecting column and drain control lines. Reference symbol XC denotes an input signal, and I/O denotes a data input/output signal. The Vp control circuit 11C has the same arrangement as the Vp control circuit 11S of FIG. 10. Reference numerals 17 to 22 denote n-channel E-type MOSFETs; and 23 denotes an inverter. In the erasing mode, the MOSFET 22 is turned on. In this case, a node N3 is set at 0 V irrespective of the logic level of XC, so that a voltage of 0 V is applied to a column control line CG1. Since the MOSFET 19 is held OFF, a drain control line D is set at a floating potential. In the writing mode, the MOSFET 17 is turned on, and the MOSFET 22 is turned off. A condition XC="H" is established in the selected circuit, and the MOSFET 21 is turned off. Therefore, when the data signal I/O is set at level "L", the column control line CG1 is set at 0 V. However, when the data signal I/O is set at level "H", the column control line CG1 is set at +25 V. The MOSFET 19 is also held OFF in the writing mode, so that the drain control line D is kept at the floating potential. In the reading mode, the MOSFETs 19 and 22 are turned on. The MOSFET 20 in the selected circuit is turned on. A voltage of 0 V is applied to the column control line CG1, and the selected drain control line D is connected to the output circuit.

Figure 12:
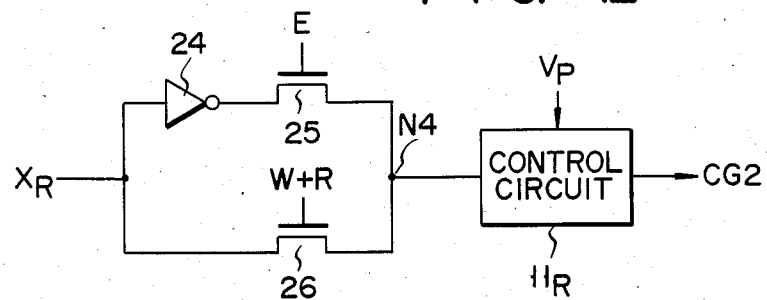
FIG. 12 is a circuit diagram of a row decoder for selecting a row control line.

FIG. 12 shows a row decoder for selecting a row control line. Reference symbol XR denotes an input signal. A Vp control circuit 11R has the same arrangement as the Vp control circuits 11S and 11C of FIGS. 10 and 11. Reference numeral 24 denotes an inverter, and 25 and 26 denote n-channel E-type MOSFETs. In the erasing mode, the MOSFET 25 is turned on and the MOSFET 26 is turned off. In this case, a condition XR="H" is established in the selected circuit. The output is then inverted by the inverter 24, and an inverted signal (0 V) appears at a node N4. Therefore, a voltage of 0 V is applied from the selected circuit to the row control line CG2. However, a condition XR="L" is established in the nonselected circuit. The output from the row decoder becomes Vp (=+25 V). In the writing mode, the MOSFET 25 is turned off, and the MOSFET 26 is turned on. In this case, the condition XR="H" is established in the selected circuit and the node N4 is set at level "H", so that the row decoder generates the voltage Vp (=+25 V). However, in the nonselected circuit, the output is set at 0 V. The operation in the reading mode is the same as that in the writing mode.

In the above embodiment, writing and erasing are controlled in accordance with combinations of potentials of 0 V, +5 V, +20 V, and +25 V. However, the present invention is not limited to this mode of operation. The relationship of potentials described above can be arbitrarily selected in accordance with the memory cell structure, the capacitances between the first control gate and the floating gate and the second control gate and the floating gate, the capacitance between the erasing gate and the floating gate, and necessary write time.

In the above embodiment, a positive voltage power supply is used. However, a negative voltage power supply can be used if the relationship of potentials similar to that described above is established.

Figure 13A:
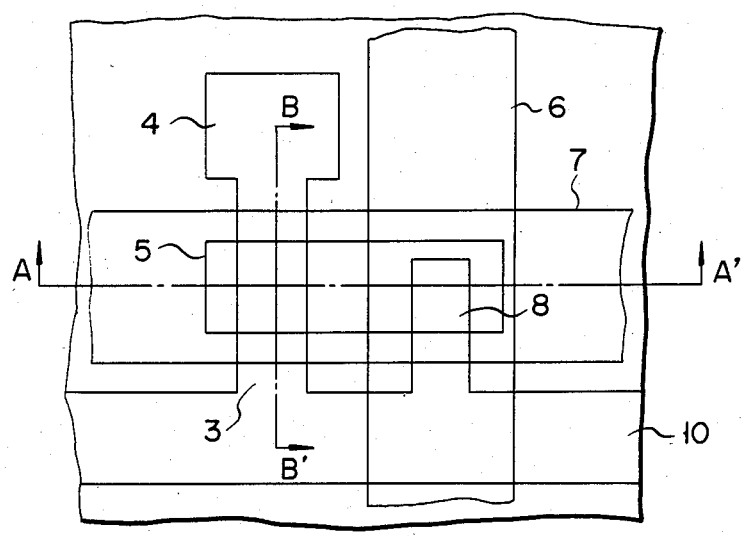
FIGS. 13A to 13C respectively show a memory cell structure according to another embodiment of the present invention corresponding to the views shown in FIGS. 1A to 1C.
Figure 13B:
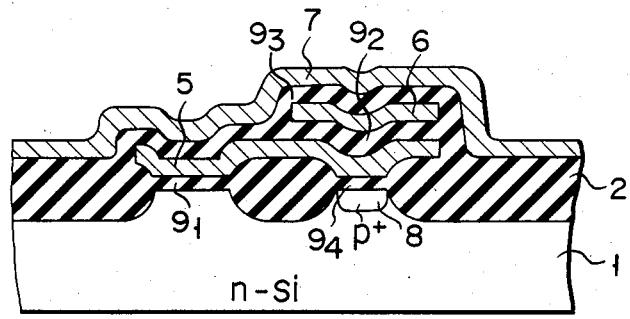
Figure 13C:
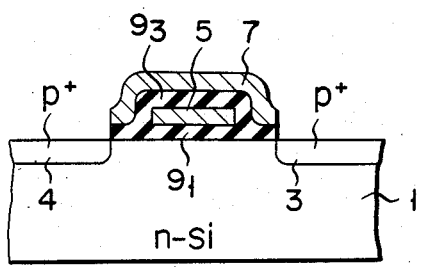

Furthermore, the present invention can also be applied to a case wherein memory cell array and their peripheral circuits comprise p-channel type elements. A p-channel type memory cell structure is shown in FIGS. 13A to 13C, corresponding to the views shown in FIGS. 1A to 1C. In this case, writing is performed such that holes are injected from the p-type erasing gate to the floating gate. Erasing is performed such that holes charged by the floating gate are discharged to the erasing gate. In this case, the relationship of potentials among the components corresponds to the one given in the above embodiment, but is inverted. In particular, the positive potentials at the respective components of the above embodiment are inverted to negative potentials to obtain the same effect as in the above embodiment. For example, a negative power supply is used, a voltage of 0 V or a low negative voltage is applied as the low voltage, and a high negative voltage is used as the high voltage selectively applied to the components.

What is claimed is:

1. A nonvolatile semiconductor memory device having a plurality of memory cells of a MOSFET structure which are arranged in a matrix form, each memory cell being formed on a semiconductor substrate and having a floating gate electrically insulated from any other component, first and second control gates capacitively coupled to said floating gate, and an erase gate for exchanging carriers with said floating gate by a tunnel effect, said first and second control gates capacitively coupled to said floating gates by means of respective capacitances CCF1 and CCF2, said floating gate capacitively coupled to said substrate by means of a capacitance CS, wherein the sum of CCF1 and CCF2 is substantially greater than CFS, said first and second control gates of the respective memory cells being commonly connected as a plurality of column control lines and a plurality of row control lines extending along orthogonal directions, respectively, said erase gates of the respective memory cells being connected as a source control line common for all bits or in units of a plurality of blocks, writing being performed such that a high voltage is applied to selected row and column control lines of said row and column control lines, a first low voltage is applied to nonselected row and column lines thereof, and a second low voltage is applied to said source control line, erasing being performed such that a low voltage is applied to selected row and column control lines, a first high voltage is applied to nonselected row and column control lines, and a second high voltage is applied to said source control line, wherein said nonvolatile semiconductor memory device comprises circuit means for selecting at least one of a writing mode, wherein the second low voltage applied to said source control line is higher than the first low voltage applied to said nonselected row and column control lines, and an erasing mode, wherein the first high voltage applied to said nonselected row and column control lines is higher than the second high voltage applied to said source control line.

2. A device according to claim 1, wherein said memory cell comprises: source and drain regions of n+-layers formed on a p-type silicon substrate; said floating gate formed on a channel region between said source and drain regions through a gate insulating film; first and second control gates sequentially formed on said floating gate through another gate insulating film; and an erase gate which is formed adjacent to the channel region of said substrate so as to be connected to said source region and which comprises an n+-layer overlapping said floating gate through a thin gate insulating film, and in that the voltages selectively applied to said source control line and said row and column control lines are 0 V or positive voltages.

3. A device according to claim 1, wherein said memory cell comprises: source and drain regions of p+-layers formed on an n-type silicon substrate; said floating gate formed on a channel region between said source and drain regions through a gate insulating film; first and second control gates sequentially formed on said floating gate through another gate insulating film; and an erase gate which is formed adjacent to the channel region of said substrate so as to be connected to said source region and which comprises an p+-layer overlapping said floating gate through a thin gate insulating film, and in that the voltages selectively applied to said source control line and said row and column control lines are 0 V or negative voltages.

4. A device according to claim 1, wherein said floating gate and said first and second control gates comprise doped-polycrystalline silicon.

5. A device according to claim 1, wherein said memory cell is constructed such that said floating gate has an offset structure so as to cover a central portion of the channel region and that said second control gate covers a remaining portion of the channel region.

* * * * *